(12) United States Patent
Kurosawa

(10) Patent No.: US 9,099,229 B2
(45) Date of Patent: Aug. 4, 2015

(54) METAL FOIL HAVING ELECTRICAL RESISTANCE LAYER, AND MANUFACTURING METHOD FOR SAME

(75) Inventor: Toshio Kurosawa, Hitachi (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 14/008,254

(22) PCT Filed: Mar. 27, 2012

(86) PCT No.: PCT/JP2012/057979
§ 371 (c)(1),
(2), (4) Date: Sep. 27, 2013

(87) PCT Pub. No.: WO2012/133439
PCT Pub. Date: Oct. 4, 2012

(65) Prior Publication Data
US 2014/0015635 A1    Jan. 16, 2014

(30) Foreign Application Priority Data
Mar. 28, 2011 (JP) ................................. 2011-070760

(51) Int. Cl.
| | |
|---|---|
| *H01C 1/012* | (2006.01) |
| *H01C 7/00* | (2006.01) |
| *C23C 14/02* | (2006.01) |
| *C23C 14/16* | (2006.01) |
| *B32B 15/01* | (2006.01) |
| *C22C 19/05* | (2006.01) |
| *H05K 1/16* | (2006.01) |
| *C22C 1/02* | (2006.01) |
| *H05K 1/09* | (2006.01) |
| *H05K 3/02* | (2006.01) |

(52) U.S. Cl.
CPC *H01C 7/00* (2013.01); *B32B 15/01* (2013.01); *C22C 1/02* (2013.01); *C22C 19/058* (2013.01); *C23C 14/022* (2013.01); *C23C 14/165* (2013.01); *H05K 1/167* (2013.01); *H05K 1/09* (2013.01); *H05K 3/022* (2013.01); *H05K 2201/0355* (2013.01)

(58) Field of Classification Search
CPC ........ H01C 17/12; H01C 7/00; C23C 14/085; C23C 14/022; C23C 14/165; C23C 14/044
USPC ........................................ 338/308, 309, 333
See application file for complete search history.

(56) References Cited

U.S. PATENT DOCUMENTS

| | | | |
|---|---|---|---|
| 5,429,843 A | 7/1995 | Masaki et al. | |
| 6,489,034 B1 | 12/2002 | Wang et al. | |
| 6,489,035 B1 | 12/2002 | Wang et al. | |
| 6,610,417 B2 * | 8/2003 | Andresakis et al. | 428/607 |
| 6,781,506 B2 * | 8/2004 | Schemenaur et al. | 338/307 |
| 7,215,235 B2 * | 5/2007 | Matsuda et al. | 338/308 |
| 8,749,342 B2 * | 6/2014 | Ohsaka et al. | 338/309 |
| 2003/0231099 A1 * | 12/2003 | Schemenaur et al. | 338/308 |
| 2011/0236714 A1 * | 9/2011 | Ohsaka et al. | 428/615 |
| 2012/0094114 A1 * | 4/2012 | Kurosawa | 428/337 |

FOREIGN PATENT DOCUMENTS

| | | |
|---|---|---|
| JP | 02247371 A | 10/1990 |
| JP | 5320874 A | 12/1993 |
| JP | 3311338 B2 | 8/2002 |
| JP | 3452557 B2 | 9/2003 |
| JP | 2009177180 A | 8/2009 |
| TW | 201016865 A | 5/2010 |
| WO | WO-2010110061 A1 | 9/2010 |

OTHER PUBLICATIONS

International Search Report for PCT/JP2012/057979, dated May 29, 2012.

* cited by examiner

*Primary Examiner* — Kyung Lee
(74) *Attorney, Agent, or Firm* — Marshall, Gerstein & Borun LLP

(57) ABSTRACT

The present invention provides a metal foil provided with an electrical resistance layer, in which peeling between the metal foil and the electrical resistance layer disposed on the metal foil can be prevented and variation in the resistivity of the resistance layer can be reduced, and a method of manufacturing the same. The present invention includes a metal foil with an electrical resistance layer including a metal foil having a surface of a ten-point mean roughness Rz, which is measured by an optical method according to 1 μm or less and the surface being treated by irradiation with ion beams at an ion beam intensity of 0.70-2.10 sec·W/cm$^2$ and an electrical resistance layer disposed on the surface of the metal foil.

9 Claims, No Drawings

METAL FOIL HAVING ELECTRICAL RESISTANCE LAYER, AND MANUFACTURING METHOD FOR SAME

TECHNICAL FIELD

The present invention relates to a metal foil provided with an electrical resistance layer and a method of manufacturing the same, and for example, relates to the metal foil provided with the electrical resistance layer applicable as a resistive element, which can be embedded on the surface or the inside of a circuit board, and a method of manufacturing the same.

BACKGROUND ART

A copper foil is generally used as a material for wirings of printed circuit boards. The copper foil may be classified into an electrolytic copper foil and a rolled copper foil depending on the manufacture method, and bonded to a resin substrate such as an epoxy resin or polyimide substrate for to use as a substrate of printed circuit boards.

On one hand, technology of forming a thin film (electrical resistance layer) made from electrical resistance materials on a copper foil as the wiring material has been proposed, as higher package density, higher performance, and miniaturization in various electronic devices has been demanded in recent years (for example, refer to Patent Literatures 1 and 2.) The electronic circuit board has to be provided with the resistive element, and use of the copper foil provided with the resistance layer allows for preparing the resistive element with a desired electric resistivity on the surface or the inside of the circuit board by etching the electrical resistance layer formed on the copper foil. This allows for making use the surface area of the substrate more effectively as compared to the conventional case in which a chip resistor is surface-mounted on the substrate by a soldering technique, thereby realizing high level integration. Formation of the resistive element within the circuit board also allows for reducing restrictions in designing of circuit and thus shortening the circuit length as compared the case in which the resistive element is mounted on the surface of the circuit board, thereby improving the electrical characteristics and reliability.

CITATION LIST

Patent Literature

Patent Literature 1: Japanese Patent Publication No. 3311338
Patent Literature 2: Japanese Patent Publication No. 3452557

SUMMARY OF INVENTION

Problem to be Solved by the Present Invention

When a resistance layer is formed on the surface of a metal foil such as a copper foil to form the resistive element, it is required to increase the adhesion strength at least to the level in which peeling does not occur between the resistance layer and the metal foil. In general, the coarser the surface of the metal foil, the better adhesion between the metal foil and the resistance layer so that in the past the surface treatment of the metal foil such as roughening treatment is performed to increase the surface roughness.

However, when the surface of a metal foil becomes too rough, variation in the resistivity of the resistance layer formed on the metal foil potentially becomes larger. In particular, when the resistance layer is made thinner, it becomes difficult to form a uniform thin film-like resistive layer on the rough surface of metal foil, for example, by sputtering. As the results, variation in the resistivity of the resistive layer becomes larger, thereby making it difficult to obtain consistently the desired electrical characteristics of the resistive element.

In view of the above problems, the present invention is to provide a metal foil provided with an electrical resistance layer, in which peeling between the metal foil and the electrical resistance layer disposed on the metal foil can be prevented and variation in the resistivity of the resistance layer can be reduced, and a method of manufacturing the same.

Means for Solving the Problem

The present inventor has performed extensive investigation to solve the above problems, and as the results, get an idea of adopting a novel metal foil which is different from a conventional one as the metal foil on which a resistance layer is disposed. That is, in the past, a metal foil of which the surface is treated to adjust the surface roughness to the specific range (for example, Rz 6-8 μm) is adopted after considering the balance of adhesion between the metal foil and the resistance layer. However, in the present invention, a metal foil provided with an electrical resistance layer and a method of manufacturing the same have been found, in which prevention of peeling between the metal foil and the resistance layer and reduction in variation in the resistivity of the resistance layer can be simultaneously realized by adopting the metal foil of which the surface is subjected to rather smoothing treatment for reducing the surface roughness as compared to the conventional level.

Further, the present inventor has found that when a thermoplastic resin layer is disposed on the resistance layer described above, the peel strength of the electric resistance layer can be further improved while preventing the peeling between the resistance layer and the metal foil.

In one aspect the present invention which is completed based on such findings relates to a metal foil with an electrical resistance layer encompassing a metal foil having a surface of a ten-point mean roughness Rz, which is measured by an optical method according to 1 μm or less and the surface being treated by irradiation with ion beams at an ion beam intensity of 0.70-2.10 sec·W/cm$^2$; and an electrical resistance layer disposed on the surface of the metal foil.

In one embodiment a metal foil provided with an electrical resistance layer in the present invention has variation of the sheet resistance of the electrical resistance layer to be below ±5%.

In another embodiment a metal foil provided with an electrical resistance layer in the present invention is further provided with a thermoplastic resin layer disposed on the electrical resistance layer.

In another embodiment a metal foil provided with an electrical resistance layer in the present invention has a peel strength of 0.7 kN/m or more.

Further in another embodiment of a metal foil provided with an electrical resistance layer in the present invention has the electrical resistance layer formed from a metal selected from the group consisted of aluminum, nickel, chromium, copper, iron, indium, zinc, tantalum, tin, vanadium, tungsten, zirconium, molybdenum, and alloys thereof.

Further in another embodiment a metal foil provided with an electrical resistance layer in the present invention has an electrical resistance layer containing any one of NiCr alloy, NiCrAlSi alloy, and NiCrSiO alloy.

Further in another embodiment a metal foil provided with an electrical resistance layer in the present invention contains an electrolytic copper foil or a rolled-copper foil as the metal foil.

In another aspect the present invention relates to a method of producing a metal foil with an electric resistance layer encompassing involving an ion beam irradiation at an ion beam intensity of 0.70-2.10 sec·W/cm$^2$ on a metal foil having a surface of a ten-point surface roughness Rz of 1 μm or less measured by an optical method; and forming an electric resistance layer on the metal foil whose surface is treated by the ion beam irradiation.

In another embodiment a manufacture method of a metal foil provided with an electrical resistance layer in the present invention further includes providing a thermoplastic resin layer on the electrical resistance layer.

According to the present invention a metal foil provided with an electrical resistance layer and a method of manufacturing the same can be provided, in which peeling between the metal foil and the resistance layer disposed on the metal foil can be prevented and variation of the resistivity of the resistance layer can be reduced.

DESCRIPTION OF EMBODIMENTS (First Embodiment)

A metal foil provided with an electrical resistance layer according to a first embodiment of the present invention includes a metal foil and an electrical resistance layer (hereinafter also referred to as "resistance layer") disposed on the metal foil. As the metal foil, for example, an electrolytic copper foil or a rolled-copper foil can be used. The term "copper foil" of the present embodiment refers to a copper alloy foil, in addition to a copper foil. When the electrolytic copper foil is used as the metal foil, it can be manufactured using a conventional electrolysis device, and in the present embodiment it is preferred to select an appropriate additive in the electrolytic process and stabilize the rotation speed of the drum so as to form an electrolytic copper foil uniform in surface roughness and equal in thickness. The thickness of the metal foil is not particularly limited, and for example, a metal foil with the thickness of 5 to 70 μm, particularly thickness of 5 to 35 μm can be used.

It is preferable that at least one of the surfaces of the metal foil is a surface in which the ten-point mean roughness Rz measured by the optical method is adjusted to 1 μm or less. Here, the surface in which "the ten-point mean roughness Rz measured by the optical method is adjusted to 1 μm or less" means that the surface roughness Rz is 1 μm or less when measured by an optical surface profile measuring instrument utilizing light interference and having resolution of 0.2 μm×0.2 μm or less.

Namely, the ten-point mean roughness Rz is defined as a value, in which only when the reference length is sampled from the roughness curve obtained by optically interferometric surface profile measuring instrument in the direction of its mean line, the sum of the average of the absolute values of the heights of the five highest profile peaks and the average of the absolute values of the depths of five deepest profile valleys measured in the vertical magnification direction from the mean line of this sampled portion and the sum is expressed in micrometer (μm).

Adoption of this measurement method allows for more specifically understanding the correlation between the surface roughness of a metal foil and the resistivity of a resistance layer. In other words, since this measurement method can estimate a trend in which the resistivity of the resistance layer is linearly increased with increasing the mean roughness Rz within a given range, manufacturers can consistently produce a resistance layer with a desired electrical resistivity by controlling the mean roughness Rz of the resistance layer in accordance with the targeted electrical resistivity.

A 3D non-contact surface profile and roughness measurement system, WYKO Optical Profiler Model NT1100 with resolution 0.2 μm×0.2 μm or less (manufactured by Veeco Instruments Inc.) can be used as an optically interferometric surface profile measuring instrument. The measurement system of the instrument is the vertical scan interferometry (VSI) system, a field of view is 120 μm×90 μm, and a measurement scan speed is 7.2 μm/sec. The interference system is the Mirau interference system (objective lens 50× and inside lens 1×).

In a metal foil related to the present embodiment, when the surface roughness Rz of the metal foil is 1 μm or less, the sufficient adhesion strength can be obtained, and even when the surface roughness Rz is 0.55 μm or less, further 0.5 μm or less, and furthermore 0.4 μm or less, its effects on the adhesive strength can be fully realized. A lower limit of the surface roughness Rz is not particularly set, and the surface roughness Rz can be adjusted, for example, to 0.1 nm or more, the value being the limit of vertical resolution in the present measurement method.

The surface of a metal foil is subjected to the treatment for cleaning. Ion beam irradiation is preferably performed as a specific surface treatment method. The adhesion strength of a metal foil to a resistance layer disposed thereon is increased by irradiating the surface of the metal foil with ion beam for cleaning.

When the intensity of ion beam irradiation is too low, sufficient adhesion strength cannot be obtained, and to the contrary, when too high, use of electricity is increased to lower the productivity. The intensity of ion beam is not limited to the following condition, but preferably adjusted to 0.70-2.10 sec·W/cm$^2$, more preferably to 0.78-1.50 sec·W/cm$^2$. The term "intensity of ion beam (ion beam intensity)" (W.min/m$^2$) described in the present embodiment is the value calculated by the following formula.

Ion beam voltage (V)×Ion beam current (A)/Treatment area (m$^2$)×processing time (sec)

The electric power for irradiating a metal foil with ion beam can be estimated, for example, in the case in which a product width is 35 cm and the line speed is 0.65 m/min (1.08 cm/sec) as follows, 0.78 (sec·W/cm$^2$)×35 (cm)×1.08 (cm/sec)=29.5 (W), indicating that the electric power for ion beam irradiation of approximately 30 W or more is sufficient as the irradiating intensity.

The thickness, size, and shape or electrical characteristics of an electrical resistance layer on a metal foil are determined optionally in accordance with circuit design. That is, selection of the type of materials for the electrical resistance layer and its thickness are determined after considering the function of a resistive element to be prepared, and not particularly limited. As an example, an electrical resistance layer with the sheet resistance of 10-250 Ω/sq or more is preferably formed. According to the electrical resistance layer obtained in first embodiment, the electrical resistance layer with little variation of the sheet resistance can be obtained. Specifically, the electrical resistance layer can be obtained in which variation of the sheet resistance is less than ±5%, further preferably ±3% or less in the length and width directions of the metal foil, respectively.

Materials for the electrical resistance layer can include, for example, a metal selected from the group consisted of aluminum, nickel, chromium, copper, iron, indium, zinc, tantalum, tin, vanadium, tungsten, zirconium, molybdenum, and alloys thereof. So far as a metal has a relatively high electrical resistance, such a metal can be preferably used for a layer of the single metal or a layer of an alloy with other elements.

Even in materials with a relatively low electrical resistance such as aluminum, silicon, copper, iron, indium, zinc, and tin they can be alloyed with other elements to increase the electrical resistance, thereby allowing for their use as the material for an electrical resistance layer. Materials for the electrical resistance layer preferably used include the material containing any one of a NiCr alloy, a NiCrAlSi alloy, and a NiCrSiO alloy.

Methods of forming an electrical resistance layer include a physical surface treatment method such as a sputtering process, a vacuum deposition process, and an ion plating process, a chemical surface treatment method such as a thermal decomposition process and a vapor phase reaction process, and a wet surface treatment method such as an electroplating process and an electroless plating process. In general, the electroplating process has an advantage of low cost production. The sputtering process has an advantage of yielding a high quality resistive element because an isotropic thin film uniform in thickness can be formed.

When a metal foil provided with an electrical resistance layer according to the first embodiment is manufactured, firstly a metal foil made of copper or a copper alloy whose surface is adjusted to have the ten-point mean roughness Rz of 1 μm or less measured by an optical method is prepared by controlling the amount of additive agent and the thickness of the metal foil. Next the surface of the metal foil is cleaned by ion beam irradiation to form the electrical resistance layer, for example, by sputtering on the surface of the metal foil after surface treatment. In order to make uniform the thickness of the electrical resistance layer a mask matched to the characteristics of a sputtering equipment is preferably used to control to the given thickness.

When the metal foil provided with the electrical resistance layer according to the first embodiment is embedded in a circuit board, for example, the side of the electrical resistance layer in the metal foil provided with the electrical resistance layer is contacted to the circuit board to bond the circuit board through heat pressing to the copper foil provided with the electrical resistance layer. A dry film as the photoresist is next heat-pressed to the metal foil to create a pattern using the photolithographic technique. Parts of the metal foil and the electrical resistance layer are next removed with an iron chloride type etching solution using the patterned photoresist as a mask and then the remaining photoresist is removed. The photoresist is further applied to the metal foil remained on the circuit board to create a pattern according to the length and the surface area of the resistive element using the photolithographic technique. The metal foil is removed by etching using the patterned photoresist to from the resistive element on the circuit board by removing the remaining photoresist. Thereafter, the insulation layer and the wiring layer are formed on the resistive element according to a well-known art of multilayer circuit board constructions, thereby enabling to embed the resistive element in the circuit board.

(Second Embodiment)

A metal foil provided with an electrical resistance layer according to a second embodiment differs from the metal foil provided with the electrical resistance layer according to the first embodiment in that the former is further provided with a thermoplastic resin layer disposed on the electrical resistance layer. A redundancy in description is avoided since others are substantially the same.

A thermoplastic resin layer preferably used includes, for example, epoxy type, polyimide type, and glass epoxy type bonding sheets, bonding films, and a primer (coating material) containing polyimide and epoxy resins. The preparative method of the thermoplastic resin layer is not particularly limited. For example, a solid-like sheet or a film may be superposed on an electrical resistance layer and heat-pressed to bond each other, or a liquid primer can be applied to the surface of the electrical resistance layer, dried, and then heat-pressed to bond. The thickness of the thermoplastic resin layer is not particularly limited, and when the thickness of the resin layer formed is at least 1 μm or more, the bond strength can be increased, and the thickness of the resin layer is more preferably 5-50 μm.

When a metal foil provided with an electrical resistance layer according to the second embodiment is manufactured, for example, a metal foil made of copper or a copper alloy is prepared such that the ten-point mean roughness Rz of the surface of the metal foil measured with optical methods is 1 μm or less. And the surface of the metal foil is treated with ion beam irradiation as needed. The electrical resistance layer is then formed, for example, by sputtering on the surface of the metal foil after surface treatment. Thereafter, a liquid primer or a bonding sheet is disposed to form a thermoplastic resin layer.

When a metal foil provided with an electrical resistance layer according to the second embodiment is embedded in a circuit board, the circuit board is bonded through heat pressing to the metal foil provided with the electrical resistance layer provided with the thermoplastic resin layer. A dry film as a photoresist is next heat-pressed to the metal foil to create a pattern using the photolithographic technique. Parts of the metal foil, the electrical resistance layer, and the thermoplastic resin layer are next removed with an iron chloride type etching solution using the patterned photoresist as a mask and the remaining photoresist is removed. Thereafter, the photoresist is applied to the metal foil remained on the circuit board and the length of the resistive element is determined, followed by creating a pattern using the photolithographic technique. The metal foil, the resistive layer, and the thermoplastic resin layer are removed by etching using the patterned photoresist as the mask and the remaining photoresist is removed to form the resistive element on the circuit board. Thereafter, the insulation layer and the wiring layer are formed on the resistive element according to a well-known art of multilayer circuit board constructions, thereby enabling to embed the resistive element in the circuit board. In the metal foil provided with the electrical resistance layer according to the second embodiment the metal foil and the electrical resistance layer resist to be peeled apart, enabling to provide the copper foil provided with electrical resistance layer having good adhesion strength in a range of 0.7 kN/m or more, preferably 0.9 kN/m or more.

EXAMPLES

Hereinafter, the examples of the present invention will be described below, but the present invention is in no way limited by the following examples.

(Sputtering Equipment)

Each sample used in the following Examples are prepared using a Vacuum Web/Roll Coater System Chamber with width of 14 inches (manufactured by CHA Industries) equipped with an ion beam source in the sputtering pretreatment for the electrical resistance layer. A 6.0 cm×40 cm Kaufman-type ion beam source, Linear Ion Source (manufactured by Veeco-Ion Tech Inc.) is used as the ion beam source. The power supply for the ion beam source is MPS-5001 from said company and the maximum output power of ion beam is 3 W/cm².

(Evaluation of Variation in Resistivity of an Electrical Resistance Layer Depending on the Surface Roughness of a Metal Foil)

Six kinds of electrolytic copper foils with the thickness of 12 μm and 18 μm are prepared. Different surface roughness of foils with the same thickness is created by changing the electric current applied in the surface roughening treatment step to adjust the formation of nodular deposits. The ten-point mean roughness Rz of the rough surface (matte side) in each specimens is determined using the optically interferometric surface profile measuring instrument described above. A sheet resistance of the electrical resistance layer is measured with the four-point probe method according to JIS-K7194 for the specimen of which a copper foil is laminated onto the epoxy resin substrate, followed by etching the whole surface of the copper foil with an alkaline etching solution to expose the resistance layer on the substrate surface.

Using the sputtering equipment described above, a Ni/Cr alloy composed of 80% by mass nickel (Ni) and 20% by mass chromium (Cr) is deposited on an electrolytic copper foil having the surface roughness Rz of 0.51-7.2 μm to adjust the thickness of the electrical resistance layer such that an average of the sheet resistances in each specimens is in the vicinity of 25 Ω/sq. The resistivity of the electrical resistance layer obtained and its variation are determined with the four-point probe method according to JIS-K7194. The results are shown in Table 1. Variation of the resistivity in the electrical resistance layer of Example 1 is small as compared to the variation in Comparative Examples 1-5, and is below ±5%.

TABLE 1

|  | Metal foil | | Electrical resistance layer | | |
| --- | --- | --- | --- | --- | --- |
|  | Thickness (μm) | Surface roughness (Rz) (μm) | Resistivity (Ω/sq) | σ (Ω/sq) | %3σ (%) |
| Example 1 | 18 | 0.51 | 25.2 | 0.41 | 4.9 |
| Comparative Example 1 | 12 | 1.2 | 24.2 | 0.41 | 5.0 |
| Comparative Example 2 | 12 | 2.4 | 25.4 | 0.53 | 6.2 |
| Comparative Example 3 | 18 | 5.1 | 25.7 | 0.64 | 7.5 |
| Comparative Example 4 | 18 | 6.3 | 24.8 | 1.09 | 13.2 |
| Comparative Example 5 | 18 | 7.2 | 25.3 | 1.16 | 13.8 |

(Evaluation of Adhesion Strength)

—Evaluation of Adhesion Strength at Interface Between an Electrical Resistance Layer (NiCr Alloy) and a Metal Foil—

Electrolytic copper foils with the thickness of 18 μm are prepared for Examples 2-4 and Comparative Examples 6-8. The surface roughness Rz in Examples 2-4 and Comparative Examples 6-8 is 0.51 μm. Using the sputtering equipment described above, the line speed, the ion beam voltage (hereinafter, refer to as IB voltage), and the ion beam current (hereinafter, refer to IB current) are adjusted to the conditions indicated in Table 2 for treatment of the rough surface of electrolytic copper foils. The ion beam intensity in Examples 2-4 and Comparative Examples 6-8 are 1.03 sec·W/cm² in Example 2, 1.37 sec·W/cm² in Example 3, 1.71 sec·W/cm² in Example 4, 0.43 sec·W/cm² in Comparative Example 6, 0.69 sec·W/cm² in Comparative Example 7, and 0.51 sec·W/cm² in Comparative Example 8, respectively.

A NiCr alloy composed of 80% by mass nickel (Ni) and 20% by mass chromium (Cr) is next deposited on the electrolytic copper foil after surface treatment using the electric power of 3.2 kW to form the electrical resistance layer.

To evaluate the adhesion strength of the electrical resistance layer the epoxy resin substrate, prepreg R-1661 (manufactured by Panasonic Electric Works Co., Ltd.) of which a fiberglass cloth is impregnated with an epoxy resin is bonded through heat pressing to the electrical resistance layer, and the peel strength of the electrical resistance layer is measured by the peel test according to IPC Standards (IPC TM-650). The results are shown in Table 2.

TABLE 2

|  | Surface treatment | | | | | Electrical resistance layer | | Evaluation results | |
| --- | --- | --- | --- | --- | --- | --- | --- | --- | --- |
|  | Surface roughness (Rz) [μm] | Line speed [m/min] | IB voltage [V] | IB current [mA] | Beam intensity [sec · W/cm²] | Sputtering power [kW] | Alloy composition | Peel strength [kN/m] | Actual peeling state |
| Comparative Example 6 | 0.51 | 0.50 | 125 | 100 | 0.43 | 3.2 | NiCr | Immeasurable | Peel between metal foil and resistance layer |
| Comparative Example 7 | 0.51 | 0.50 | 200 | 100 | 0.69 | 3.2 | NiCr | Immeasurable | Peel between metal foil and resistance layer |
| Comparative Example 8 | 0.51 | 0.50 | 300 | 50 | 0.51 | 3.2 | NiCr | Immeasurable | Peel between metal foil and resistance layer |

TABLE 2-continued

|  | Surface roughness (Rz) [μm] | Line speed [m/min] | Surface treatment | | | Electrical resistance layer | | Evaluation results | |
|---|---|---|---|---|---|---|---|---|---|
|  |  |  | IB voltage [V] | IB current [mA] | Beam intensity [sec·W/cm²] | Sputtering power [kW] | Alloy composition | Peel strength [kN/m] | Actual peeling state |
| Example 2 | 0.51 | 0.50 | 300 | 100 | 1.03 | 3.2 | NiCr | 0.20 | Normal peel between resistance layer and substrate |
| Example 3 | 0.51 | 0.50 | 400 | 100 | 1.37 | 3.2 | NiCr | 0.21 | Normal peel between resistance layer and substrate |
| Example 4 | 0.51 | 0.50 | 500 | 100 | 0.71 | 3.2 | NiCr | 0.21 | Normal peel between resistance layer and substrate |

As indicated in Table 2, peeling does not occur between the metal foil and the electrical resistance layer in Examples 2-4 in which appropriate surface treatment with ion beam is performed. On one hand, peeling occurs between the metal foil and the electrical resistance layer in Comparative Examples 6-8 and the peel strength cannot be measured.

—Evaluation of Adhesion Strength in a Metal Foil Provided with an Electrical Resistance Layer (NiCr Alloy) Provided with a Thermoplastic Resin Layer—

Electrolytic copper foils with the thickness of 18 μm are prepared for Examples 5-7. The surface roughness Rz of the copper foil in Examples 5-7 is 0.51 μm. Using the sputtering equipment described above the line speed, the IB voltage, and the IB current are adjusted to the similar conditions to Examples 2-4 in which peeling does not occur at the interface between the copper foil and the resistance layer in Table 2, and applied for treatment of the rough surface of the electrolytic copper foil. The ion beam intensity in Examples 5-7 are 1.03 sec·W/cm² in Example 5, 1.37 sec·W/cm² in Example 6, and 1.71 sec·W/cm² in Example 7, respectively.

A NiCr alloy composed of 80% by mass nickel (Ni) and 20% by mass chromium (Cr) is next deposited on the electrolytic copper foil after surface treatment using the electric power of 3.2 kW to form the electrical resistance layer. A liquid primer is applied to the surface of the electrical resistance layer and then dried to form a thermoplastic resin layer with an average coating thickness of 5 μm on the electrical resistance layer. Further an epoxy substrate is bonded through heat pressing to the thermoplastic resin layer to form a multilayer board of which the peel strength, the peel strength after solder float treatment, and the resistance to attack by hydrochloric acid (HCl) are measured. The term "peel strength" (peel strength at ambient temperature (normal state)) in Table 3 is the peel strength evaluated by a practically similar method indicated in Table 2, and the term "peel strength after solder float treatment" is the peel strength of specimens immersed in a molten solder bath at 260° C. for 20 seconds, that is, the peel strength after exposure to heat. The "resistance to attack by HCl" is evaluated by measuring the peel strength of the electrical resistance layer in specimens before and after immersed in 18% by weight hydrochloric acid for 1 hour (at ambient temperature) and expressing the deterioration ratio in peel strength with respect to the initial peel strength in the percent loss, the value of indicating the chemical resistance in the circuit board forming step. The results are shown in Table 3.

TABLE 3

|  |  |  | Surface treatment | | | Electrical resistance layer | | Evaluation results | | |
|---|---|---|---|---|---|---|---|---|---|---|
|  | Surface roughness (Rz) [μm] | Line speed [m/min] | IB voltage [V] | IB current [mA] | Beam intensity [sec·W/cm²] | Sputtering power [kW] | Alloy composition | Peel strength [kN/m] | Peel strength after solder float treatment [kN/m] | Resistance to attack by HCl [%] |
| Example 5 | 0.51 | 0.50 | 300 | 100 | 1.03 | 3.2 | NiCr | 1.00 | 0.98 | 5.1 |
| Example 6 | 0.51 | 0.50 | 400 | 100 | 1.37 | 3.2 | NiCr | 0.98 | 0.98 | 2.5 |
| Example 7 | 0.51 | 0.50 | 500 | 100 | 0.71 | 3.2 | NiCr | 0.98 | 0.96 | 3.5 |

As indicated in Examples 5-7 the peel strength is improved as compared to Examples 2-4 by further disposing the thermoplastic resin layer on the surface of the electrical resistance layer. Also in Examples 5-7 both the peel strength after solder float treatment and the resistance to attack by HCl demonstrate good results.

—Evaluation of Adhesion Strength at the Interface Between an Electrical Resistance Layer (NiCrAlSi Alloy) and a Metal Foil—

Electrolytic copper foils with the thickness of 18 μm are prepared for Examples 8-11 and Comparative Example 9. The surface roughness Rz of the copper foil in Examples 8-11 and Comparative Example 9 is 0.51 μm. Using the sputtering equipment described above, the line speed, the IB voltage, and the IB current are adjusted to the conditions indicated in Table 4 for treating the rough surface of the electrolytic copper foil. The ion beam intensity in Examples 8-11 and Comparative Example 9 are 0.84 sec·W/cm² in Example 8, 1.25 sec·W/cm² in Example 9, 1.67 sec·W/cm² in Example 10, 2.09 sec·W/cm² in Example 11, and 0.52 sec·W/cm² in Comparative Example 9, respectively.

A NiCrAlSi alloy composed of 55% by mass nickel (Ni), 40% by mass chromium (Cr), 1% by mass aluminum (Al), and 4% by mass silicon (Si) is next deposited on the electrolytic copper foil after surface treatment using the electric power of 3.2 kW to form the electrical resistance layer. Further the epoxy resin substrate described above is bonded through heat pressing to the electrical resistance layer, and the peel strength is measured with the similar method in Table 2. The results are shown in Table 4.

the copper foil in Examples 12-15 is 0.51 µm. Using the sputtering equipment described above, the line speed, the IB voltage, and the IB current are adjusted to the similar conditions to Examples 8-11 in which peeling does not occur at the interface between the copper foil and the resistance layer in Table 4 for treating the rough surface of the electrolytic copper foil. The ion beam intensity in Examples 12-15 are 0.84 sec·W/cm² in Example 12, 1.25 sec·W/cm² in Example 13, 1.67 sec·W/cm² in Example 14, and 2.09 sec·W/cm² in Example 15, respectively.

A NiCrAlSi alloy composed of 55% by mass nickel (Ni), 40% by mass chromium (Cr), 1% by mass aluminum (Al), and 4% by mass silicon (Si) is next deposited on the electrolytic copper foil after surface treatment using the electric power of 3.2 kW to form the electrical resistance layer. A liquid primer is applied to the surface of the electrical resistance layer and then dried to form a thermoplastic resin layer with an average coating thickness of 5 µm. Further an epoxy resin substrate is bonded through heat pressing to the thermoplastic resin layer to form a multilayer board of which the peel strength, the peel strength after solder float treatment, and the resistance to attack by HCl are measured. The evaluation results are shown in Table 5.

TABLE 4

| | Surface treatment | | | | | Electrical resistance layer | | Evaluation results | |
| --- | --- | --- | --- | --- | --- | --- | --- | --- | --- |
| | Surface roughness (Rz)[µm] | Line speed [m/min] | IB voltage [V] | IB current [mA] | Beam intensity [sec·W/cm²] | Sputtering power [kW] | Alloy composition | Peel strength [kN/m] | Actual peeling state |
| Comparative Example 9 | 0.51 | 0.41 | 125 | 100 | 0.52 | 3.2 | NiCrAlSi | Immeasurable | Peel between metal foil and resistance layer |
| Comparative Example 8 | 0.51 | 0.41 | 200 | 100 | 0.84 | 3.2 | NiCrAlSi | 0.35 | Normal peel between resistance layer and substrate |
| Comparative Example 9 | 0.51 | 0.41 | 300 | 50 | 1.25 | 3.2 | NiCrAlSi | 0.32 | Normal peel between resistance layer and substrate |
| Example 10 | 0.51 | 0.41 | 400 | 100 | 1.67 | 3.2 | NiCrAlSi | 0.33 | Normal peel between resistance layer and substrate |
| Example 11 | 0.51 | 0.41 | 500 | 100 | 2.09 | 3.2 | NiCrAlSi | 0.33 | Normal peel between resistance layer and substrate |

As indicated in Table 4, peeling does not occur between the metal foil and the electrical resistance layer in Examples 8-11 in which conditions for ion beam irradiation are adjusted to an appropriate range, and peeling occurs between the electrical resistance layer and the substrate. On one hand, in Comparative Example 9 peeling occurs between the metal foil and the electrical resistance layer and the peel strength of the electrical resistance layer cannot be measured.

—Evaluation of Adhesive Strength of a Metal Foil Provided with an Electrical Resistance Layer (NiCrAlSi alloy) Provided with a Thermoplastic Resin Layer—

Electrolytic copper foils with the thickness of 18 µm are prepared for Examples 12-15. The surface roughness Rz of

TABLE 5

| | Surface treatment | | | | | Electrical resistance layer | | Evaluation results | | |
| --- | --- | --- | --- | --- | --- | --- | --- | --- | --- | --- |
| | | | | | | | | | Peel strength after solder | |
| | Surface roughness (Rz) [µm] | Line speed [m/min] | IB voltage [V] | IB current [mA] | Beam intensity [sec·W/cm²] | Sputtering power [kW] | Alloy composition | Peel strength [kN/m] | float treatment [kN/m] | Resistance to attack by HCl [%] |
| Example 12 | 0.51 | 0.41 | 200 | 100 | 0.84 | 3.2 | NiCrAlSi | 1.09 | 1.09 | 2.8 |

TABLE 5-continued

|  | Surface roughness (Rz) [μm] | Line speed [m/min] | Surface treatment | | | Electrical resistance layer | | Evaluation results | | |
| --- | --- | --- | --- | --- | --- | --- | --- | --- | --- | --- |
|  |  |  | IB voltage [V] | IB current [mA] | Beam intensity [sec·W/cm²] | Sputtering power [kW] | Alloy composition | Peel strength [kN/m] | Peel strength after solder float treatment [kN/m] | Resistance to attack by HCl [%] |
| Example 13 | 0.51 | 0.41 | 300 | 100 | 1.25 | 3.2 | NiCrAlSi | 1.06 | 1.08 | 3.8 |
| Example 14 | 0.51 | 0.41 | 400 | 100 | 1.67 | 3.2 | NiCrAlSi | 1.08 | 1.07 | 1.2 |
| Example 15 | 0.51 | 0.41 | 500 | 100 | 2.09 | 3.2 | NiCrAlSi | 1.04 | 1.07 | 5.7 |

As indicated in Examples 12-15 the peel strength is improved as compared to Examples 8-11 by disposing the thermoplastic resin layer on the surface of the electrical resistance layer. Also both the peel strength after solder float treatment and the resistance to attack by HCl demonstrate good results.

—Evaluation of Adhesion Strength at the Interface Between an Electrical Resistance Layer (NiCrSiO Alloy) and a Metal Foil—

Electrolytic copper foils with the thickness of 18 μm are prepared for Comparative Examples 10-12 and Examples 16 and 17. The surface roughness Rz of the copper foil in Comparative Examples 10-12 and Examples 16 and 17 is 0.51 μm. Using the sputtering equipment described above, the line speed, the IB voltage, and the IB current are adjusted to the conditions indicated in Table 6 for treating the rough surface of the electrolytic copper foil. The ion beam intensity in Comparative Examples 10-12 and Examples 16 and 17 are 0.24 sec·W/cm² in Comparative Example 10, 0.39 sec·W/cm² in Comparative Example 11, 0.58 sec·W/cm² in Comparative Example 12, 0.78 sec·W/cm² in Example 16, and 0.97 sec·W/cm² in Example 17, respectively.

A NiCrSiO alloy composed of 5% by mass nickel (Ni), 75% by mass chromium (Cr), 13% by mass silicon (Si), and 7% by mass oxygen (O) is next deposited on the electrolytic copper foil using the electric power of 1.5 kW to form the electrical resistance layer. Further the epoxy resin substrate described above is bonded through heat pressing to the electrical resistance layer to measure the peel strength. The results are shown in Table 6.

TABLE 6

|  | Surface treatment | | | | | Electrical resistance layer | | Evaluation results | |
| --- | --- | --- | --- | --- | --- | --- | --- | --- | --- |
|  | Surface roughness Rz [μm] | Line speed [m/min] | IB voltage [V] | IB current [mA] | Beam intensity [sec·W/cm²] | Sputtering power [kW] | Alloy composition | Peel strength [kN/m] | Actual peeling state |
| Comparative Example 10 | 0.51 | 0.88 | 125 | 100 | 0.24 | 1.5 | NiCrSiO | Immeasurable | Peel between metal foil and resistance layer |
| Comparative Example 11 | 0.51 | 0.88 | 200 | 100 | 0.39 | 1.5 | NiCrSiO | Immeasurable | Peel between metal foil and resistance layer |
| Comparative Example 12 | 0.51 | 0.88 | 300 | 100 | 0.58 | 1.5 | NiCrSiO | Immeasurable | Peel between metal foil and resistance layer |
| Example 16 | 0.51 | 0.88 | 400 | 100 | 0.78 | 1.5 | NiCrSiO | 0.53 | Normal peel between resistance layer and substrate |
| Example 17 | 0.51 | 0.88 | 500 | 100 | 0.97 | 1.5 | NiCrSiO | 0.51 | Normal peel between resistance layer and substrate |

As indicated in Table 6, peeling does not occur between the metal foil and electrical resistance layer in Examples 16 and 17 in which the conditions for ion beam irradiation is adjusted to an appropriate range, and peeling occurs between the resistance layer and the substrate. On one hand, in Comparative Examples 10-12 peeling occurs between the metal foil and the electrical resistance layer and the peel strength of the electrical resistance layer cannot be measured.

—Evaluation of Adhesive Strength of a Metal Foil Provided with an Electrical Resistance Layer (NiCrSiO Alloy) Provided with a Thermoplastic Resin Layer—

Electrolytic copper foils with the thickness of 18 μm are prepared for Examples 18 and 19. The surface roughness Rz of the copper foil in Examples 18 and 19 is 0.51 μm. Using the sputtering equipment described above, the line speed, the IB voltage, and the IB current are adjusted to the conditions indicated in Table 7 for treating the rough surface of the electrolytic copper foil. The ion beam intensity in Examples 18 and 19 are 0.78 sec·W/cm² in Example 8 and 0.97 sec·W/cm² in Example 19, respectively.

A NiCrSiO alloy composed of 5% by mass nickel (Ni), 75% by mass chromium (Cr), 13% by mass silicon (Si), and 7% by mass oxygen (O) is next deposited on the electrolytic copper foil using the electric power of 1.5 kW to form the electrical resistance layer. A liquid primer is applied to the surface of the electrical resistance layer and then dried to form a thermoplastic resin layer with an average coating thickness of 5 μm. An epoxy resin substrate is bonded through heat pressing to the thermoplastic resin layer to form a multilayer board of which the peel strength, the peel strength after solder float treatment, and the resistance to attack by HCl are measured. The evaluation results are shown in Table 7.

TABLE 7

|  | Surface treatment |  |  |  | Electrical resistance layer |  | Evaluation results |  |  |
|---|---|---|---|---|---|---|---|---|---|
|  | Surface roughness (Rz)[μm] | Line speed [m/min] | IB voltage [V] | IB current [mA] | Beam intensity [sec·W/cm²] | Sputtering power [kW] | Alloy composition | Peel strength [kN/m] | Peel strength after solder float treatment [kN/m] | Resistance to attack by HCl [%] |
| Example 18 | 0.51 | 0.88 | 400 | 100 | 0.78 | 1.5 | NiCrSiO | 1.29 | 1.33 | 0.9 |
| Example 19 | 0.51 | 0.88 | 500 | 100 | 0.97 | 1.5 | NiCrSiO | 1.42 | 1.36 | 0.2 |

As indicated in Examples 18 and 19 the peel strength is improved as compared to Examples 16 and 17 by disposing the thermoplastic resin layer on the surface of the electrical resistance layer. Also both the peel strength after solder float treatment and the resistance to attack by HCl demonstrate good results.

—Evaluation of Adhesive Strength of a Metal Foil Provided with an Electrical Resistance Layer Provided with a Thermoplastic Resin Layer (Bonding Sheet)—

Electrolytic copper foils with the thickness of 18 μm are prepared for Examples 20-22. The surface roughness Rz of the copper foil in Examples 20-22 is 0.51 μm. Using the sputtering equipment described above the line speed, the IB voltage, and the IB current are adjusted to the conditions indicated in Table 8 for treating the rough surface of the electrolytic copper foil. Three kinds of alloys (NiCr alloy, NiCrAlSi alloy, and NiCrSiO alloy. The alloy composition is the same as the above) indicated in Table 8 are next deposited on the electrolytic copper foil to form the electrical resistance layer using the electric power indicated in Table 8. A bonding sheet E53 (manufactured by Shin-Etsu Chemical Co., Ltd.) with the thickness of 25 μm is disposed on the surface of the electrical resistance layer to form a thermoplastic resin layer, onto which the epoxy resin substrate described above is bonded through thermal pressing. Thereafter, the peel strength in normal state, the peel strength after solder float treatment, and the resistance to attack by HCl are measured. The results are shown in Table 8.

TABLE 8

|  | Surface treatment |  |  |  | Electrical resistance layer |  | Evaluation results |  |  |
|---|---|---|---|---|---|---|---|---|---|
|  | Surface roughness (Rz) [μm] | Line speed [m/min] | IB voltage [V] | IB current [mA] | Beam intensity [sec·W/cm²] | Sputtering power [kW] | Alloy composition | Peel strength [kN/m] | Peel strength after solder float treatment [kN/m] | Resistance to attack by HCl [%] |
| Example 20 | 0.51 | 0.50 | 500 | 100 | 1.71 | 3.2 | NiCr | 0.74 | 0.64 | 3.7 |
| Example 21 | 0.51 | 0.41 | 500 | 100 | 2.09 | 3.2 | NiCrAlSi | 1.00 | 0.93 | 7.2 |

TABLE 8-continued

| | | Surface treatment | | | Electrical resistance layer | | Evaluation results | | |
|---|---|---|---|---|---|---|---|---|---|
| | | IB | IB | Beam | | | | Peel strength after solder | |
| | Surface roughness (Rz) [μm] | Line speed [m/min] | voltage [V] | current [mA] | intensity [sec · W/cm²] | Sputtering power [kW] | Alloy composition | Peel strength [kN/m] | float treatment [kN/m] | Resistance to attack by HCl [%] |
| Example 22 | 0.51 | 0.88 | 500 | 100 | 0.97 | 1.5 | NiCrAlSi | 0.94 | 0.92 | 1.4 |

As indicated in Examples 20-22 the peel strength is significantly improved when the bonding sheet is used as the thermoplastic resin. Also both the peel strength after solder float treatment and the resistance to attack by HCl demonstrate good results.

The invention claimed is:

1. A metal foil with an electrical resistance layer comprising:
    a metal foil having a surface with a ten-point mean roughness Rz of 1 μm or less as measured by an optical method treated with irradiation with ion beams at an ion beam intensity of 0.70 sec·W/cm²-2.10 sec·W/cm²; and
    an electrical resistance layer disposed on the treated surface of the metal foil.

2. The metal foil with the electrical resistance layer according to claim 1, wherein the electrical resistance layer has variation of a sheet resistance of less than ±5%.

3. The metal foil with the electrical resistance layer according to claim 1, further comprising a thermoplastic resin layer disposed on the electrical resistance layer.

4. The metal foil with the electrical resistance layer according to claim 3, wherein a peel strength is 0.7 kN/m or more.

5. The metal foil with the electrical resistance layer according to claim 1, wherein the electrical resistance layer is formed from a metal selected from the group consisting of aluminum, nickel, chromium, copper, iron, indium, zinc, tantalum, tin, vanadium, tungsten, zirconium, molybdenum, and alloys thereof.

6. The metal foil with the electrical resistance layer according to claim 1, wherein the electrical resistance layer comprises any one of NiCr alloy, NiCrAlSi alloy, and NiCrSiO alloy.

7. The metal foil with the electrical resistance layer according to claim 1, wherein the metal foil comprises an electrolytic copper foil or a rolled-copper foil.

8. A method of producing a metal foil with an electric resistance layer comprising:
    treating a surface on a metal foil having a ten-point surface roughness Rz of 1 μm or less as measured by an optical method with ion beam irradiation at an ion beam intensity of 0.70 sec·W/cm²-2.10 sec·W/cm²; and
    forming an electric resistance layer on the treated surface of the metal foil.

9. The method according to claim 8, further comprising providing a thermoplastic resin layer on the electrical resistance layer.

* * * * *